United States Patent [19]

Crowley et al.

[11] 4,038,920

[45] Aug. 2, 1977

[54] SCREEN POSITIONING AND SQUEEGEE DRIVE MEANS FOR SCREEN PRINTER

[75] Inventors: Norman R. Crowley; Gilbert N. Fuchs, both of Evansville, Ind.

[73] Assignee: Evana Tool & Engineering Inc., Evansville, Ind.

[21] Appl. No.: 575,267

[22] Filed: May 7, 1975

[51] Int. Cl.² .......................... B41F 15/08; B41F 15/46
[52] U.S. Cl. ...................................... 101/123; 101/126
[58] Field of Search ................. 101/114, 115, 123, 126

[56] References Cited

U.S. PATENT DOCUMENTS

| | | | |
|---|---|---|---|
| 2,783,709 | 3/1957 | Thomas | 101/123 |
| 2,863,381 | 12/1958 | Steck et al. | 101/123 |
| 2,866,404 | 12/1958 | Laupman | 101/123 |
| 3,138,095 | 6/1964 | Wells | 101/123 |
| 3,483,819 | 12/1969 | Hughes, Jr. | 101/123 |
| 3,486,441 | 12/1969 | Hillman et al. | 101/123 X |
| 3,492,942 | 2/1970 | Forslund | 101/123 |
| 3,543,679 | 12/1970 | Wahl | 101/123 X |
| 3,828,671 | 8/1974 | Fuchs | 101/123 |

*Primary Examiner*—Edgar S. Burr
*Assistant Examiner*—R. E. Suter

*Attorney, Agent, or Firm*—Larson, Taylor and Hinds

[57] ABSTRACT

An apparatus for silk screen printing of circuit boards is provided which comprises a motor driven shaft having three cams keyed thereto which control the positioning of a silk screen and the movement of a squeegee. The latter is controlled relative to the screen so that the squeegee makes forward and return printing movements over the screen so as to print two circuit boards per shaft revolution. Two of the aforementioned cams respectively drive first and second slide members. The second slide carries the squeegee and is mounted on the first slide at right angles thereto. The first and second slides cooperate so as to cause the movement of the squeegee to describe a pattern roughly in the shape of a figure eight as the squeegee comes into printing engagement with the screen and then is lifted over and behind the inking compound at the end of both the forward and return printing strokes. The position of the squeegee and the silk screen are readily adjustable and the entire apparatus can be hydraulically tilted to provide access to the silk screen. A fourth cam mounted on the shaft triggers a switch which provides a workpiece indexing signal twice per revolution.

8 Claims, 7 Drawing Figures

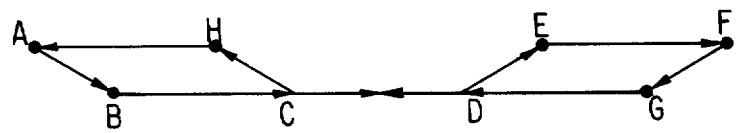
FIG. 5
FIG. 6
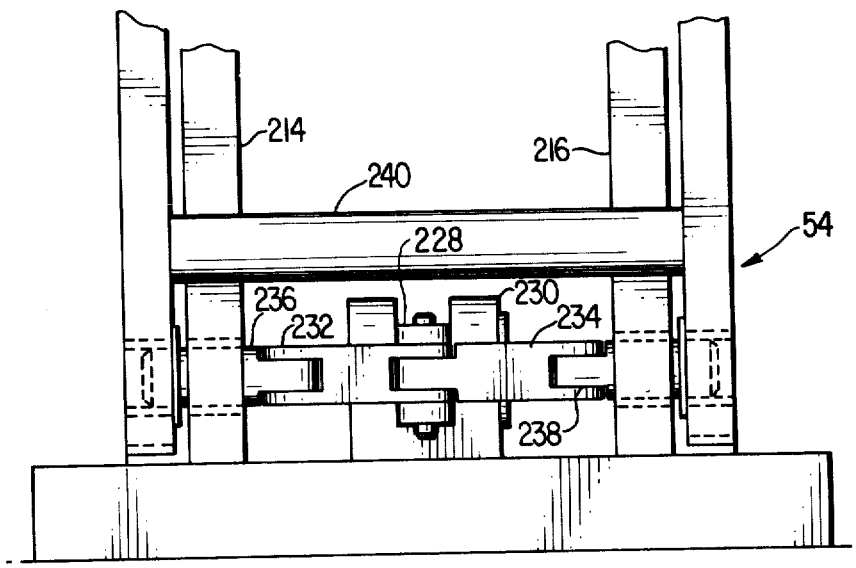

SCREEN POSITIONING AND SQUEEGEE DRIVE MEANS FOR SCREEN PRINTER

BACKGROUND — FIELD OF THE INVENTION

This invention relates to printing apparatus and, more particularly, apparatus for silk screen printing of circuit boards and the like.

BACKGROUND — DESCRIPTION OF THE PRIOR ART

Prior art devices used in the silk screen printing of circuit boards characteristically comprise complex hydraulically-controlled and mechanical linkage-controlled mechanisms. Such devices suffer a number of disadvantages including, for example, non-uniform product quality during large production runs, difficulties in accurately positioning the printing mechanisms relative to the workpiece, and high maintenance requirements both in terms of the durability of the parts and the ease of replacement.

SUMMARY OF THE INVENTION

The present invention provides for a circuit board silk screen printing apparatus with various set screws which allow accurate positioning of the squeegee and silk screen in relation to a workpiece and also with an hydraulic tilt mechanism to provide access to the silk screen. Thus, this invention discloses an apparatus which meets the close tolerance requirements of microcircuitry and the industrial use requirements of rapid inspection and removal of the silk screen.

In accordance with a preferred embodiment of the invention, a silk screen printing apparatus is provided which comprises a drive mechanism, a guide mechanism, including first and second cooperating slides movable responsive to the drive mechanism which guides a squeegee for printing engagement with a silk screen, and a positioning mechanism, including a third slide which is movable responsive to the drive mechanism and is adapted to mount a silk screen thereon, for bringing the silk screen mounted on the third slide into contact with a workpiece.

Additional features and advantages of the invention will be set forth in, or apparent from, the detailed description of preferred embodiments of the invention found hereinbelow.

BRIEF DESCRIPTION OF THE DRAWINGS

FIG. 5 is a diagram of the path described by a squeegee during a full cycle of the cams;

FIG. 6 is an end view of the locking mechanism which is shown in FIG. 2; and

DETAILED DESCRIPTION OF THE PREFERRED EMBODIMENTS

Figure 2:
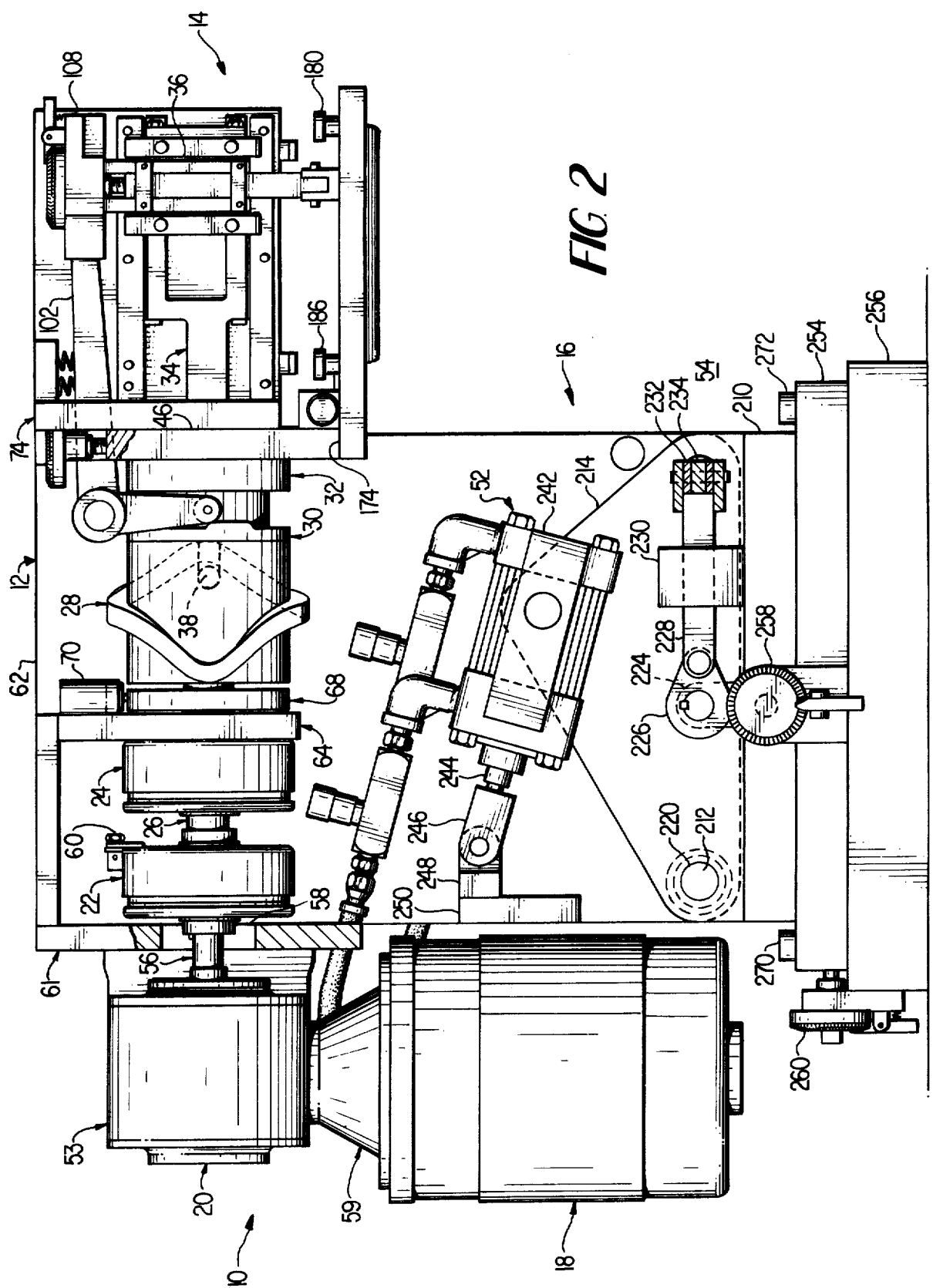
FIG. 2 is a side elevation view of the mechanical screen printing apparatus of FIG. 1 with its housing removed.

Referring to the drawings, and, in particular, to FIG. 2, the printing apparatus of the invention can be conveniently divided into four functional units for purposes of description. These units include a drive system generally denoted 10, a cam system denoted 12, a slide and squeegee system denoted 14, and a tilting and locking system denoted 16. Before describing these various units in detail, the basic function and primary components of each unit will be briefly considered.

The drive system 10 basically comprises a motor 18, a set of reduction gears 20, a clutch 22, and a brake 24. The purpose of the drive system is to cause a main shaft 26 to rotate and, in turn, operate the cam system 12 and, consequently, the slide and squeegee system 14.

The cam system 12 basically comprises three cams, to wit, a barrel cam 28, a face cam 30, and a grooved cam 32, all of which are co-axially keyed to main shaft 26. In general, the purpose of this cam system 12 is to accurately position the elements of the slide and squeegee system 14.

Figure 3:
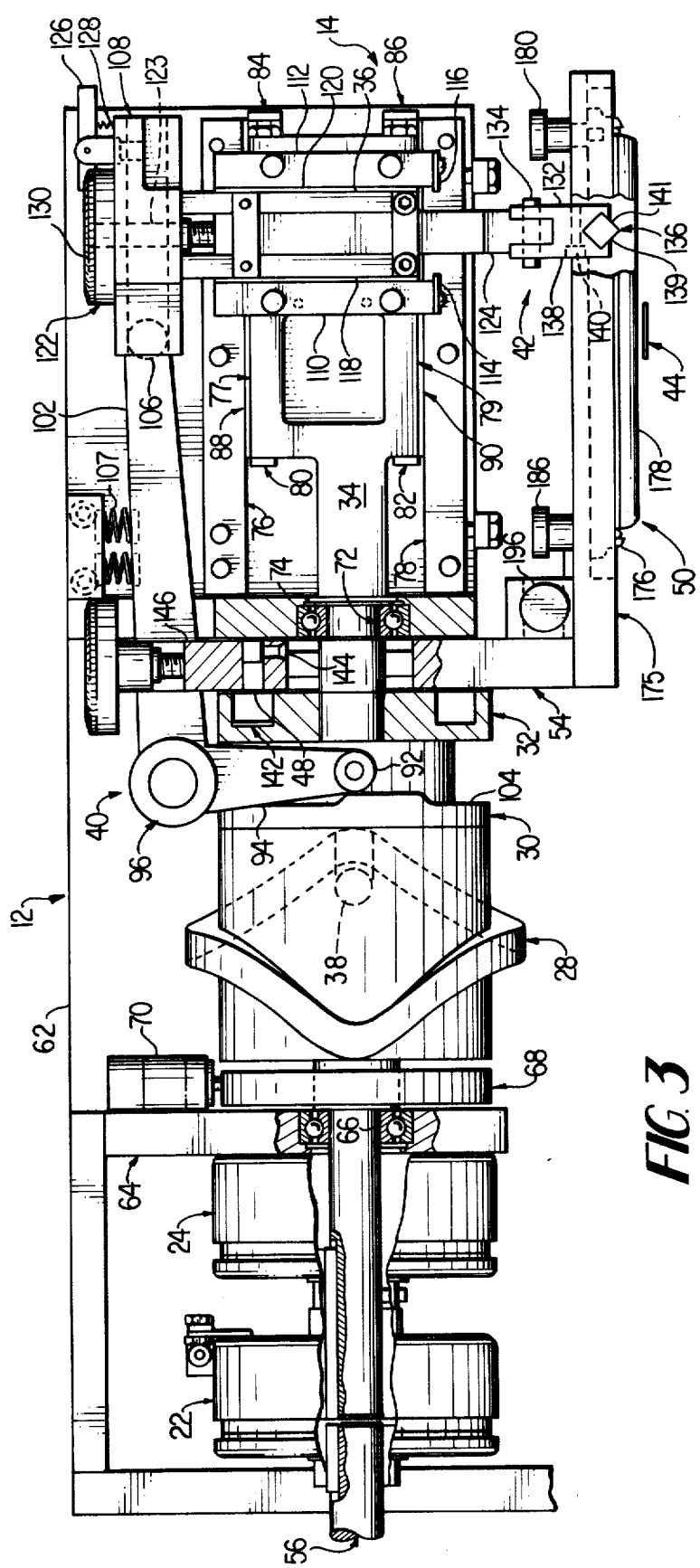
FIG. 3 is an enlarged side elevation of the cam and squeegee mechanisms as shown in FIG. 2.
Figure 4:
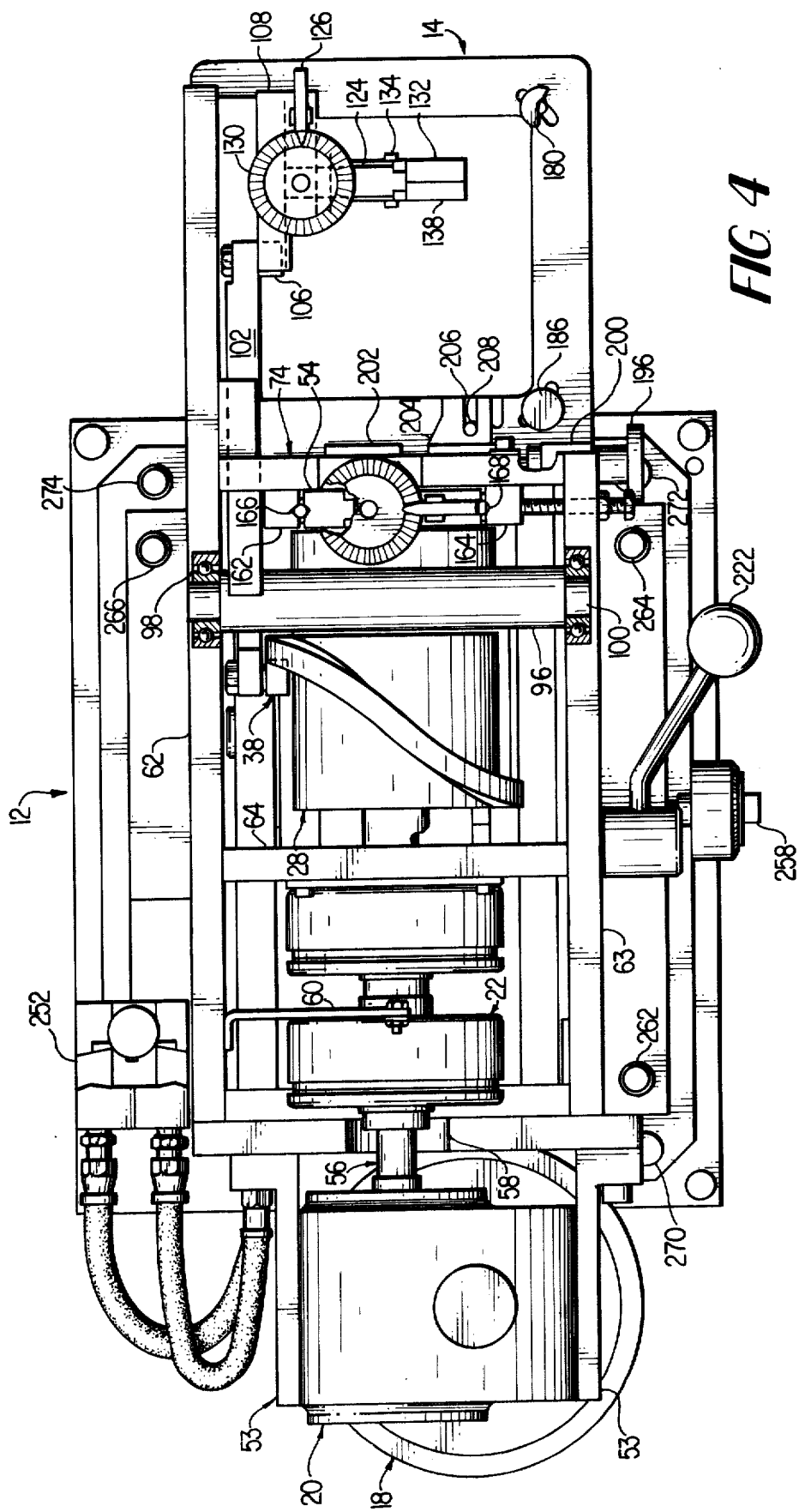
FIG. 4 is a plan view of the apparatus shown in FIG. 2.
Figure 7:
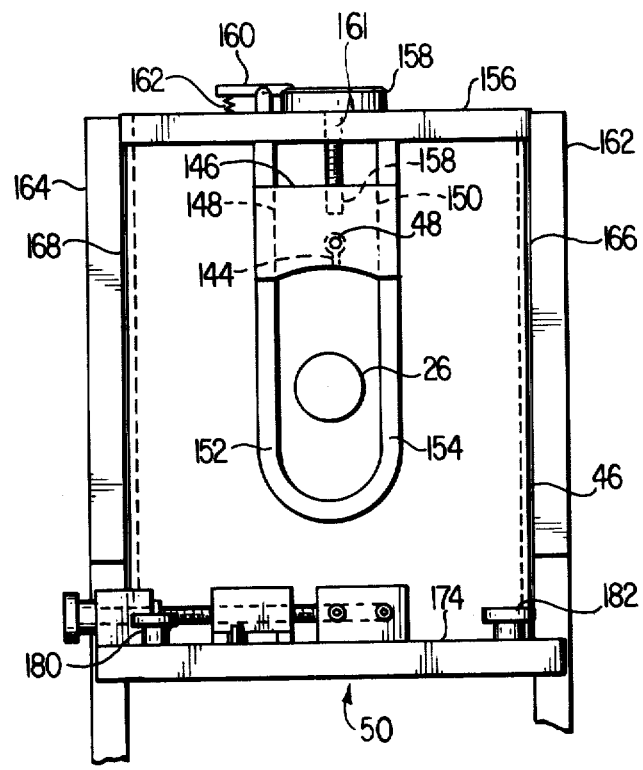
FIG. 7 is an end elevation of the silk screen holder positioning mechanism with the end housing plate removed.

The slide and squeegee system 14 basically comprises first and second slides 34 and 36 which are moved responsive to the barrel cam 28 and the face cam 30, respectively, through the agency of a cam follower roller 38 and a cam follower assembly 40 respectively (see FIGS. 3 and 4). Slides 34 and 36 are responsible for the complex movement of a squeegee assembly 42 described hereinbelow which provides the requisite printing on a workpiece 44. The slide and squeegee system also comprises a third slide 46 which is responsive to the grooved cam 32 through the agency of a third follower arm 48 (FIG. 7). The third slide 46 accurately positions the silk screen assembly 50 FIGS. 3 and 7 relative to the workpiece 44.

The tilting and locking system 16, which is located directly below the cam system 12, as illustrated, comprises an hydraulic piston system 52 and a locking system 54 (see FIG. 6). With locking system 54 in the unlocked position, (see FIG. 1), the hydraulic piston system 52 can tilt a housing 57, (See FIG. 1), which mounts the drive system 10, the cam system 12 and the slide and squeegee system 14. In this tilted position the silk screen assembly 50 can easily be inspected or changed.

Turning now to a detailed description of the printing apparatus of the invention and referring, in particular, to FIG. 2, motor 18 of the drive system 10 is mounted, by means of bracket 59, below, and drives, the set of reduction gears 20 and. The reduction gears 20 are mounted on the back of the housing rear wall 61 by means of a mounting bracket 53. The reduction gears 20 are connected through a shaft 56 to a 22 which drives shaft 26, the shaft 56 extending through an aperture 58 (FIGS. 2 and 4) in housing rear wall 61. A mounting bracket 60 mounts clutch 22 on the first housing side wall 62. As shown in FIG. 3, brake 24 is coaxially mounted on shaft 26 and is supported by a downwardly depending support bracket 64, which itself is mounted between first and second side walls 62 and 63. The shaft 26 is mounted for rotation by a set of ball bearings 66 located within the downwardly depending support bracket 64. A switch operating cam 68 is secured to shaft 26 for rotation therewith. Cam 68 is shaped such that after each half rotation of shaft 26 a microswitch 70, mounted directly above cam 68 on support bracket 64, is triggered or actuated. The microswitch 70 provides an electrical signal which controls a series of workpieces such as that indicated at 44 are located so that the workpieces are moved into a printing position.

The cam system 12, powered by drive system 10, comprises barrel cam 28 which controls horizontal movement of squeegee assembly 42 and is also referred to for shorthand purposes as a "squeegee horizontal" cam, face cam 30 which controls vertical movement of squeegee assembly 42 and is referred to as a "squeegee vertical" cam, and grooved cam 32 which controls vertical positioning of the screen 178 and is referred to as a "screen vertical" cam. Cams 28, 30, and 32 are keyed, in that order to shaft 26. Shaft 26 rotates in a second set of ball bearings 72 which are mounted in housing front wall 74. Housing front wall 74, housing rear wall 61 and first and second housing side walls 62 and 63 enclose the cam system 12.

The barrel cam 28 engages first cam follower roller 38 which is mounted on a first slide 34. The first slide 34 translates back and forth horizontally as shaft 26 and 28 rotate. As shown in FIG. 3, first slide 34 is mounted on two parallel guide rails 76 and 78 which are in turn mounted on side housing wall 62.

Two linear sets of ball bearings 88 and 90 are retained between pairs of end stops 82 and 86, and 80 and 84. These sets of ball bearings 88 and 90 are positioned in the space between each guide rail 76 and 78 and the respective first and second juxtaposed sides 77 and 79 of first slide 34. Thus slide 34 can move back and forth on the sets of ball bearings 88 and 90 between parallel guide rails 76 and 78.

The face cam 30 engages a cam follower roller 92 (see FIG. 3) which is mounted on a cam follower arm 94. The cam follower arm 94 is welded onto a shaft 96 which is mounted for rotation by first and second sets of ball bearings 98 and 100. Bearing sets 98 and 100 are, in turn, mounted in apertures (not shown) in the housing side walls 62 and 63 (see FIG. 4). A control arm 102 is welded onto shaft 96 at a right angle to cam follower arm 94. Arm 102 translates variations in the face cam surface 104, which are sensed by cam follower roller 92 as face cam 30 rotates to an arm roller 106. Thus the follower arm roller 92, the follower arm 94, the shaft 96, the arm 102, and the arm roller 106 combine to form the cam follower assembly 40 which causes the second slide 36 to move in response to the rotation of face cam 30. Specifically, roller 106 moves up and down as face cam 30 rotates.

Constant tension is placed on arm 102 and thus on cam follower roller 92 through a pair of springs 107 (see FIG. 3) which are mounted on the housing side wall 62 directly above arm 102. Consequently, follower roller 92 is held in continuous contact with face cam 30.

Arm roller 106 engages a guide block 108 which is screwed to the second slide 36. The up and down movement of arm roller 106 causes second slide 36 to translate up and down between parallel guide rails 110 and 112 which are mounted on the first slide 34 (see FIG. 3).

Two linear sets of ball bearings 118 and 120 are retained by end stops 114 and 116 which are mounted to the bottom edges of guide rails 110 and 112. The second slide 36 thus translates up and down between parallel guide rails 110 and 112 mounted on the first slide 34 which itself translates back and forth. Consequently, the path described by the movement of second slide 36 is orthogonal to the path described by the movement of first slide 34.

Figure 1:
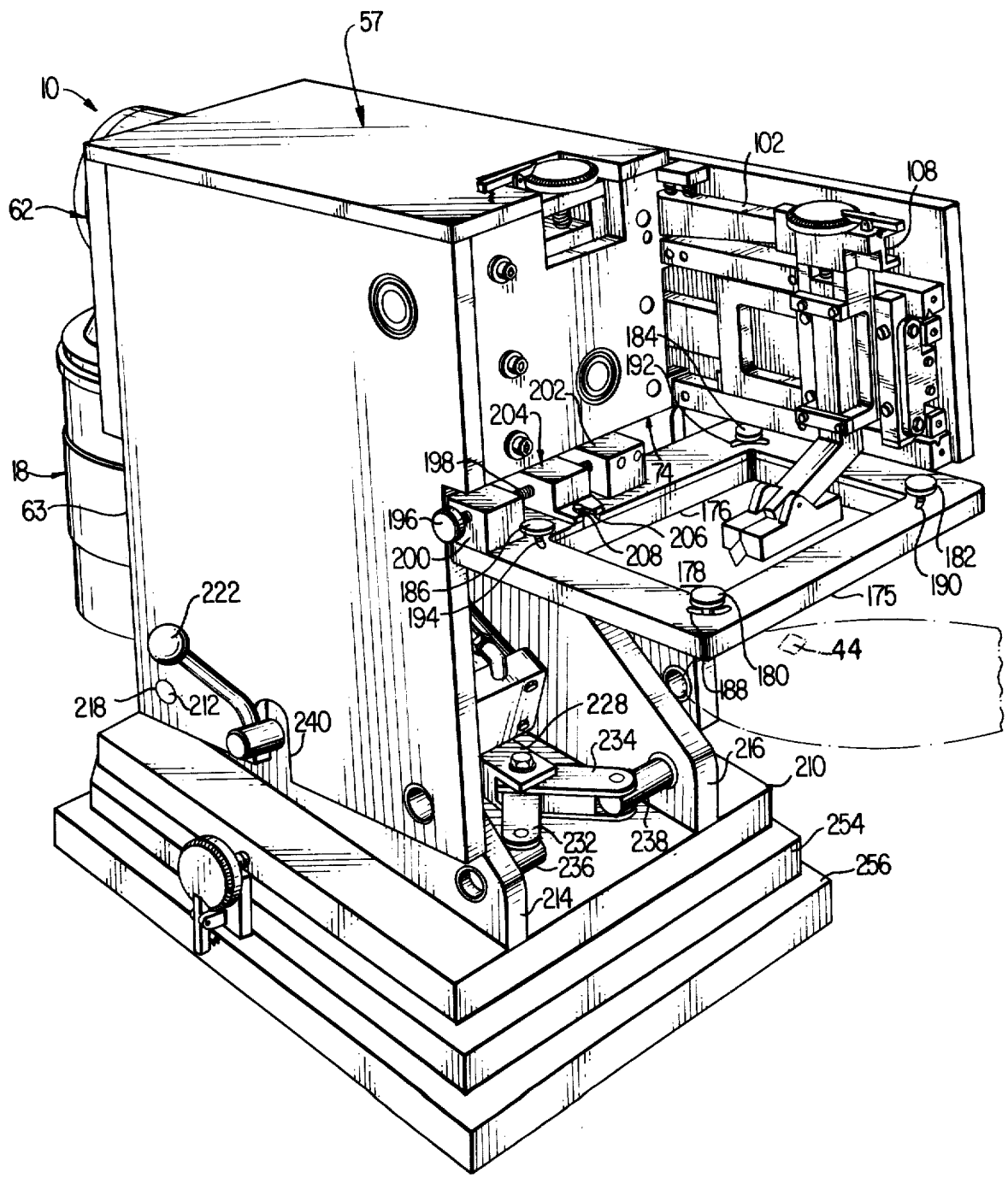
FIG. 1 is a perspective view of the mechanical screen printing apparatus in accordance with the invention.

As can perhaps best be seen in FIG. 3, positioned above guide block 108 is a set screw 122. The shank 123 of set screw 122 passes through a bore in guide block 108 and is mounted in a threaded bore at the end of a squeegee arm 124. A squeegee arm 124, which is part of the squeegee assembly 42, is mounted on the second slide 36 and extends outwardly therefrom as an oblique angle, as shown in FIG. 1. Set screw 122 is used to accurately adjust the position of arm 124 relative to second slide 36.

As can be seen in FIG. 3, a locator member 126 is mounted on guide block 108. The locator 126 is held in place by spring 128. On top of set screw 122 is mounted a beveled gear 130. Locator 126 can engage the grooves of the bevel gear 130 and thus prevent the accidental turning of set screw 122. Thus by passing the locator member 126 in such a manner so as to contract spring 128, the locator 126 is released from the beveled gear 130 so as to permit the set screw to be turned. Locator member 126 and set screw 122 enable adjustment of squeegee arm 124, and thus the entire squeegee assembly 42 relative to the second slide 36 and hence relative to the silk screen assembly 50 and the workpiece 44. These adjustments are made in increments of 0.002. inch.

A squeegee holder 132 (see FIG. 3) is pivotably connected to the lower portion of the squeeze arm 124 through a pivot pin 134 so that the squeegee holder 132 is capable of rotation.

A squeegee 136, which is preferably constructed of a resiliently deformable material, is held against squeegee holder 132 by a squeegee clamp 138 which is attached to squeegee holder 132 by means of a screw 140. The squeegee printing surfaces 139 and 141 are positioned at angles of 45° to the plane of the silk screen assembly.

With the arrangement described above, as cams 28 and 30 rotate through a one half revolution (180°), first slide 34 and second slide 36 move in such a manner as to cause squeegee 136 to describe a complex path ABCDEF as shown in FIG. 5. Path FGDCHA is described by squeegee 136 during the second half rotation of cams 28 and 30.

As shown in FIG. 3, the grooved cam 32 engages a cam follower roller 142 which is mounted on the third follower arm 48, attached to an adjusting block 146 by means of a screw 144. The adjusting block 146 has grooved sides 148 and 150 (see FIG. 7) which receive guide rails 152 and 154. Guide rails 152, 154 are machined along the inner surfaces of u-shaped third slide 46. Thus the adjusting block is free to move up and down on guide rails 152 and 154. A block 156 is fastened across the top of the u-shaped slide 46. Upon this block 156 is mounted a set screw 158, a locator member 160 and a spring 162 similar in design and function to set screw 122, locator member 126, and spring 128, respectively. Set screw 158 passes through a bore 161 in block 156 and is mounted in a threaded bore 158 in the top surface of adjusting block 146. Thus, adjusting block 146 can be positioned relative to third slide 46 in increments of 0.002 inch and as grooved cam 32 rotates, the adjusting block 146 and the third slide 46 describe an up and down motion.

The motion of the third slide 46 is guided by parallel guide rails 162 and 164 which are mounted on the inside surface of housing front wall 74 and which are similar in construction to guide rails 76 and 78. Linear sets of ball bearings 166 and 168 are similar in construction and function to the linear ball bearing sets 118 and 120 associated with second slide 36 as described above.

Bolted to the lower edge 174 of the third slide 46 is the silk screen assembly 50. Thus, as grooved cam 32 rotates, third slide 46 and silk screen assembly 50 describe an up and down motion.

Silk screen assembly 50 (FIG. 3) comprises a silk screen frame holder 175, a silk screen frame 176, a silk screen 178 and four adjustment knobs 180, 182, 184, and 186 (see FIG. 1). The silk screen frame holder 175 is that part of the silk screen assembly 50 which is bolted to the lower edge 174 of the third slide 46. The silk screen 178 is mounted in a silk screen frame 176 and secured to the silk screen frame holder 175 by the four adjustment knobs 180 to 186 (see FIG. 1). The adjustment knobs 180 to 186 are slidable in slots 188, 190, 192 and 194 (see FIG. 1) which are formed in frame holder 175 and which cooperate with adjustment knobs 180 to 186 to enable the silk screen 178 and silk screen 176 to be accurately positioned relative to a workpiece 44.

The positioning of the silk screen 178 is accomplished using a knob 196 which has its threaded shank 198 mounted in first and second blocks 200 and 202 (see FIG. 1). When knob 196 is turned, block 204 is displaced along the axis of threaded shank 198. Block 204 has a slot which engages pin 208 mounted on silk screen frame 176. Consequently, when knobs 180 to 186 are loosened, turning of knob 196 causes displacement of block 204 along shank 198, thereby displacing pin 208 and silk screen frame 196, and also displacing knobs 180 to 186 in slots 188 to 194. Thus the turning of knob 196 angularly positions the silk screen 178 and frame 176 relative to the silk screen frame holder 174 and the workpiece 44.

The operation of that part of the invention so far described is as follows: As noted, a half rotation of shaft 26 causes squeegee 136 to describe path ABCDEF in FIG. 5. More specifically, before squeegee 136 can complete the movement from point A to point B, the third slide 54 moves downward causing silk screen 178 to contact the workpiece 44. At one point B squeegee 136 contacts silk screen 178 and inking compound which was placed on screen 178. As squeegee 136 moves horizontally from point B to point C, always in contact with silk screen 178, it collects the inking compound. As the squeegee 136 moves from point C to point D a pattern is printed on the workpiece 44. As previously noted, squeegee 136 has printing surfaces 139 and 141 which are positioned at angles of 45° to the plane of mesh of the silk screen 178. Thus the pressure of the squeegee 136 on silk screen 178, which is approximately 25 lbs. and the inclined printing surfaces 139 and 141 of the squeegee causes inking compound to be pressed through the interstices of the mesh of the silk screen 178 and onto the workpiece 44. It is noted that if the printing surfaces 139 and 141 were perpendicular to the silk screen 178, there would be more of a tendency for the inking compound to be pushed ahead of the squeegee 136 and not through the mesh of the silk screen 178. Then, again through the cooperating action of first slide 34 and second slide 36, squeegee 136 lifts over the collected inking compound and moves from point D to point E. Finally squeegee 136 moves from point E to point F. Silk screen 178 is then lifted from the workpiece 44 by third slide 54 and a half rotation of shaft 26 has been completed.

At his point in the operation cam 58 triggers microswitch 70 which indexes another workpiece under silk screen 178. The squeegee 136 is now ready for a return print stroke. On the return stroke the squeegee describes path FGDCHA shown in FIG. 5. It is noted that the movement from point F to point G places the squeegee 136 behind the collected inking compound and thus the squeegee 136 is ready again to collect ink as the squeegee 136 moves from point G to point D and print a workpiece as the squeegee 136 moves from point D to C. The movement from point C to point H to point A lifts the squeegee 136 over the collected ink and positions the squeegee 136 for a new print stroke.

The remaining portion of the invention concerns the tilting and locking system 16, (FIG. 2) is located directly below the cam system 12, and which allows the silk screen 178 to be easily inspected and changed. As noted above, the tilting and locking system 16 comprises hydraulic piston system 52 which is best seen in FIG. 2 and locking system 54 which is best seen in FIGS. 2 and 6.

The housing/side walls 62 and 63 are pivotally attached to base 210 (see FIG. 1) by a pivot dowel 212. First and second right triangularly shaped plates 214 and 216 (FIGS. 1 and 2) are bolted to base 210. Pivot dowel 212 fits through apertures 218 in side wall 63 and 220 (FIG. 2) in triangular plate 214 and through similarly located apertures in side wall 62 and plate 216.

The locking system 54 (FIG. 2) comprises a handle 222, (FIGS. 1 and 4) a shaft 224, (FIG. 2) a cam 226, a first linkage 228, a guide block 230, second and third linkage 232 and 234, (FIG. 6) and first and second connecting rods 236 and 238.

The handle 222 (see FIGS. 1 and 4) is keyed to shaft 224 (FIG. 2) which extends through a slot 240 at the base of side housing wall 63. Shaft 224 is pivotally mounted in two mounting apertures located at the base of triangular plate 214 and 216. Between plates 214 and 216, a cam 226 is keyed to shaft 224. Pivotably attached to arm 226 is the first linkage 228. Linkage 228 rests in u-shaped guide block 230 (FIG. 6) which is bolted to base 210 between plates 214 and 216. At the end of first linkage 228 are pivotally attached in a tongue and groove arrangement second and third linkages 232 and 234. Pivotally attached to second and third linkages 232 and 234 are first and second connecting rods 236 and 238. First rod 236 is housed in an aperture in triangular plate 214 and can slide into an aperture in side housing wall 63 when the housing side wall 63 contacts base 210. Similarly, second rod 238 is housed in an aperture in triangular plate 216 and can slide into an aperture in side housing wall 62 when the side housing wall 62 contacts base 210. Dowel 240, which connects and supports side housing walls 62 and 63, is positioned directly above connecting rods 236 and 238 (see FIG. 6).

When handle 222 is in a horizontal position, connecting rods 236 and 238 are located within the aperture in side housing walls 62 and 63, thus locking the silk screen printing apparatus to base 210. When handle 222 is in a vertical position, connecting rods 236 and 238 no longer engage the aperture in side housing walls 62 and 63 and the hydraulic piston system 52 can tilt the apparatus away from base 210 (see FIG. 1) about the axis of pivotal dowel 212.

The hydraulic piston system 52 comprises an hydraulic cylinder 242, an hydraulic piston 244, a clevis 246, a swivel eye 248, a second rear housing wall 250 (see FIG. 2), and a control lever 252 (see FIG. 4). The hydraulic cylinder 242 is pivotally mounted between the upper ends of rectangular plates 214 and 216. The hydraulic piston 244 extends from the rear of hydraulic cylinder 242. Mounted to the end of piston 244 is a u-shaped clevis 246. This clevis 246 is pivotally attached to swivel eye 248, which is mounted to second rear housing wall 250. When control lever 252 is engaged, piston 244 and clevis 246 push against swivel eye 248 and rear housing wall 252, thereby tilting the side walls 62 and 63 and thus the entire apparatus away from base 210 and triangular plates 214 and 216. This tilted position (see FIG. 1) provides easy recess to the silk screen 178.

Finally an adjustment means comprising first and second adjusting knobs 258 and 260 enable the entire silk screen printing apparatus to be positioned relative to a workpiece 44. Below base 210 are second and third base plates 254 and 256 (see FIGS. 1 and 2). Below handle 222 and mounted to base plate 254 is the first knob 258, similar in construction and function to knob 122 described above. The shaft of knob 258 contacts base plate 210. Below motor 18 and mounted to base plate 256 is the second knob 260. The shaft of knob 260 contacts to second base plate 254. When screws 262, 264, 266 and 268 (hidden by control lever 252), which fasten first base plate 210 to second base plate 254, are loosened, a turn of knob 258 will cause base 210 to slide over base 254 with a direction of motion perpendicular to side housing wall 62. When screws 270, 272, 274, and 276 (hidden in FIG. 4 by control lever 252), which fasten second base plate 254 to third base plate 256, are loosened, a turn of knob 260 will cause base 254 to slide over base 256 in a direction perpendicular to rear housing wall 61. Thus the position of the entire printing apparatus can be adjusted relative to base 256 and the workpiece 44.

Although the present invention has been described relative to an exemplary embodiment thereof, it will be understood by those skilled in the art that variations and modifications can be effected in these embodiments without departing from the scope and spirit of the invention.

I claim:

1. A printing apparatus for printing a workpiece comprising:
   an elongate drive shaft;
   means for rotating said elongate drive shaft; first and second cams coaxially mounted on said drive shaft so as to rotate therewith;
   a squeegee carrier arm for carrying a squeegee; and
   first and second slides operatively connected to said first and second cams and to said squeegee carrier arm for controlling movement of said squeegee carrier arm in accordance with the angular position of said drive shaft, said second slide being slidably mounted on said first slide, said printing apparatus further including a set screw with an elongate threaded shank, said second slide having a smooth bore, through which said shank extends, for rotatably mounting said threaded shank and wherein said squeegee carrier arm has a threaded bore for receiving 2. A printing apparatus as claimed in claim 1 further comprising a frame for mounting a silk screen, and frame movement control means for controlling the movement of said silk screen, mounted on said frame, into and out of contact with a workpiece on which a pattern is to be printed, wherein said frame movement control means includes a third cam mounted on said shaft for rotation therewith and a third slide operatively connected to said third cam, said silk screen frame being fixedly mounted to said third slide and wherein said frame movement control further includes an adjusting block slidably mounted to said third slide and including a cam follower extending therefrom for engaging said third cam, said third slide having a smooth bore therein, and said printing apparatus further including a set screw with a threaded shank rotatably received in and extending through said smooth bore, said adjusting block having a threaded bore that receives the portion of said shank extending through said smooth bore such that rotation of said set screw provides positioning of said third slide relative to said adjusting block.

3. A printing apparatus in accordance with claim 1 wherein said set screw further includes a knob fixedly attached to said threaded shank for rotating said shank, said knob having grooves therein, said apparatus further including a spring-biased lever mounted to said second slide for engaging said grooves so as to lockingly position said knob.

4. A printing apparatus in accordance with claim 1, further including means for varying the position of said silk screen relative to said frame.

5. A printing apparatus in accordance with claim 1 further including a base, a housing pivotably mounted at one end of said base, said housing having mounted thereto said shaft, said rotating means and said carrier arm, said base having at least one rod slidably mounted thereto, said housing having an aperture aligned so as to receive said rod for lockingly positioning said housing with respect to said base, said printing apparatus further including means for pivoting said housing away from said base.

6. A silk screen printing apparatus comprising:
   a housing;
   a squeegee carrier arm for carrying a squeegee;
   a silk screen frame holder for mounting a frame holding a silk screen;
   a single drive shaft mounted to said housing;
   means for rotating said drive shaft mounted to said housing
   control means responsive to rotation of said drive shaft for controlling the movement of said squeegee carrier arm and said silk screen holder such that, during a first half rotation of said shaft, said silk screen is moved into engagement with a workpiece and simultaneously said squeegee carried by said squeegee arm follows a first operating path wherein the squeegee comes into contact with said silk screen mounted on said silk screen frame holder, translates thereacross in a first direction so as to provide printing on a workpiece in contact with said silk screen and lifts from the silkscreen and said silk screen lifting from the workpiece, such that, during a second half rotation of said shaft, said silk screen is moved into engagement with another workpiece that has replaced the first workpiece and the squeegee follows a second operating path, wherein the squeegee comes into contact with the silk screen, translates across the silk screen in a direction opposite to said first direction to provide printing on the workpiece in contact with the silk screen, and thereafter lifts from the silk screen wherein said control means includes a first cam, second cam, and a third cam mounted coaxially on said single drive shaft, said control means further including a first slide having a cam follower for engaging said first cam, said first slide being translationally displaced along a path generally parallel to the axis of said drive shaft as said drive shaft rotates, said control means including a second slide responsive to said second cam, said second slide slidably mounted on said first slide, said second slide translationally displaced along a path generally perpendicular to the path of said first slide as said drive shaft rotates, said squeegee carrier arm mounted on said second slide, and said control means including a third slide having a cam follower engaging said third cam, said third slide translationally displaced along a path generally parallel to the displacement path of said second slide, as said drive shaft rotates, said silk screen frame holder mounted on said third slide, the plane of said silk screen being generally perpendicular to the displacement path of said third slide.

7. A silk screen printing apparatus in accordance with claim 6 wherein said first cam is mounted adjacent said second cam which is mounted adjacent said third cam, and wherein said third slide is positioned adjacent said third cam, said third slide having an aperture means therethrough for receiving said drive shaft, said aperture means large enough to accommodate the translational displacement of said third slide relative to said drive shaft, said control means further including an L-shaped follower arm with first and second legs operably connecting said second slide to said second cam, said L-shaped follower arm pivotally mounted to said housing and including a first roller means rotatably mounted to said first leg of said L-shaped arm so as to engage said second cam and a second roller means rotatably mounted to the second leg of said L-shaped arm, and wherein said second slide has a generally horizontal groove therein for receiving said second roller means, the rotation of said second cam on said drive shaft displacing said first roller means generally horizontally, said second roller means being displaced generally vertically so as to translationally displace said second slide relative to said first slide.

8. A silk screen printing apparatus in accordance with claim 7 wherein said first cam comprises a barrel cam, said second cam comprises a face cam, and said third cam comprises a grooved cam, said cam follower of said third engaging the groove of said grooved cam.

* * * * *